(12) United States Patent
Hikmet et al.

(10) Patent No.: US 10,011,766 B2
(45) Date of Patent: Jul. 3, 2018

(54) LIGHTING DEVICE WITH POLYMER CONTAINING LUMINESCENT MOIETIES

(71) Applicant: PHILIPS LIGHTING HOLDING B.V., Eindhoven (NL)

(72) Inventors: Rifat Ata Mustafa Hikmet, Eindhoven (NL); Ties Van Bommel, Horst (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 375 days.

(21) Appl. No.: 14/405,410

(22) PCT Filed: Jun. 3, 2013

(86) PCT No.: PCT/IB2013/054561
§ 371 (c)(1),
(2) Date: Dec. 4, 2014

(87) PCT Pub. No.: WO2013/182968
PCT Pub. Date: Dec. 12, 2013

(65) Prior Publication Data
US 2015/0166882 A1  Jun. 18, 2015

Related U.S. Application Data

(60) Provisional application No. 61/657,310, filed on Jun. 8, 2012.

(51) Int. Cl.
*C09K 11/02* (2006.01)
*C09K 11/06* (2006.01)
(Continued)

(52) U.S. Cl.
CPC ........ *C09K 11/025* (2013.01); *C08G 63/6856* (2013.01); *C09K 11/02* (2013.01);
(Continued)

(58) Field of Classification Search
None
See application file for complete search history.

(56) References Cited

U.S. PATENT DOCUMENTS

| 3,510,732 A | 5/1970 | Amans |
| 4,469,980 A | 9/1984 | Johnson |

(Continued)

FOREIGN PATENT DOCUMENTS

| CN | 102159664 A | 8/2011 |
| JP | 2005223276 A | 8/2005 |

(Continued)

OTHER PUBLICATIONS

C. Lee et al; "Synthesis and Properties of Violet Light-Emitting Polymeric Fluorphore", Dyes and Pigments, Elsevier Applied Science Publ., Barking, GB, vol. 52, No. 1, Jan. 1, 2002, pp. 37-45, XP004329594.

(Continued)

*Primary Examiner* — Gregory D Clark (57) ABSTRACT

The invention provides a lighting device comprising (a) a light source, for producing light source light, and (b) a light converter, wherein the converter comprises a matrix of a first polymer, the matrix containing discrete regions comprising a second polymer with luminescent functionality, wherein the second polymer comprises an aromatic polyester comprising luminescent moieties, and wherein the first polymer is chemically different from the aromatic polyester. The invention also provides a light converter, wherein the converter comprises a matrix of a first polymer, the matrix containing discrete regions comprising a second polymer with luminescent functionality, wherein the second polymer comprises an aromatic polyester comprising luminescent moieties, and wherein the first polymer is chemically different from the aromatic polyester.

17 Claims, 6 Drawing Sheets

(51) Int. Cl.
  *H05B 33/14*   (2006.01)
  *C08G 63/685*  (2006.01)
  *F21V 9/16*    (2006.01)
  *H01L 33/50*   (2010.01)
  *H01S 5/00*    (2006.01)
  *F21K 9/64*    (2016.01)
  *H05B 33/20*   (2006.01)

(52) U.S. Cl.
  CPC ............... *C09K 11/06* (2013.01); *F21K 9/64* (2016.08); *F21V 9/16* (2013.01); *H01L 33/502* (2013.01); *H01S 5/005* (2013.01); *H05B 33/14* (2013.01); *H05B 33/145* (2013.01); *C09K 2211/1011* (2013.01); *C09K 2211/1044* (2013.01); *C09K 2211/1466* (2013.01); *H05B 33/20* (2013.01)

(56) References Cited

U.S. PATENT DOCUMENTS

| | | | |
|---|---|---|---|
| 6,103,006 | A  | 8/2000  | Di Pietro |
| 6,850,002 | B2 | 2/2005  | Danielson et al. |
| 7,115,217 | B2 | 10/2006 | Kummer et al. |
| 7,579,769 | B2 | 8/2009  | Wu et al. |
| 2005/0179366 | A1 | 8/2005 | Rose et al. |
| 2006/0055316 | A1 | 3/2006 | Wu et al. |
| 2006/0138938 | A1 | 6/2006 | Tan et al. |
| 2008/0149165 | A1 | 6/2008 | Hoeks et al. |
| 2010/0065873 | A1 | 3/2010 | Bhattacharya et al. |
| 2010/0123155 | A1 | 5/2010 | Pickett et al. |
| 2010/0247893 | A1 | 9/2010 | Zimmerman |
| 2011/0068322 | A1 | 3/2011 | Pickett et al. |

FOREIGN PATENT DOCUMENTS

| | | | | |
|---|---|---|---|---|
| JP | 2007-165718 | * | 6/2007 | ............. H01L 51/50 |
| WO | 2007009010 A2 | | 1/2007 | |
| WO | 2012042434 A1 | | 4/2012 | |
| WO | 2012042438 A1 | | 4/2012 | |
| WO | 2012085780 A1 | | 6/2012 | |
| WO | 2012107852 A1 | | 8/2012 | |

OTHER PUBLICATIONS

P. Uthirakumar, et al., "Yellow Light-Emitting Polyer Bearing Fluorescein Dye Units: Photophysical Property and Application as Luminescence Converter of a Hybrid LED", Science Direct, Reactive & Functional Polymers 67 (2007), pp. 341-347.

* cited by examiner

LIGHTING DEVICE WITH POLYMER CONTAINING LUMINESCENT MOIETIES

CROSS-REFERENCE TO PRIOR APPLICATIONS

This application is the U.S. National Phase application under 35 U.S.C. § 371 of International Application No. PCT/IB13/054561, filed on Jun. 03, 2013, which claims the benefit of U.S. Provisional Patent Application No. 61/657,310, filed on Jun. 08, 2012. These applications are hereby incorporated by reference herein.

FIELD OF THE INVENTION

The invention relates to a lighting device comprising a light source, for producing light source light and a converter (for converting at least part of the light source light into luminescence), to such converter per se, as well as to a method for making such converter.

BACKGROUND OF THE INVENTION

Luminescent materials in matrices are known in the art. U.S.2006055316, for instance, describes color electroluminescent displays comprising a sub-pixel structure and method for making the same. The sub-pixel structure has an electroluminescent phosphor, which emits blue light, and a photo luminescent phosphor, which emits at least one other color as a result of absorption of the blue light. U.S.2006055316 also describes such photo luminescent phosphor materials. For instance, this document describes a method for making a photo luminescent phosphor material, the method comprising mixing a pigment powder and a matrix material to provide a uniform dispersion of the pigment powder in the matrix material, wherein the pigment material comprises a solid solution of organic photo luminescent molecules, the matrix material being chemically and physically compatible with the pigment powder such that the photo luminescent efficiency of the organic photo luminescent molecules are substantially maintained.

SUMMARY OF THE INVENTION

Organic phosphors are currently considered in remote phosphor applications. One of the problems associated with organic phosphors is related to their stability. We have surprisingly found that in polymers such as aromatic polyesters PET (poly ethylene therephthalate) and PEN (poly ethylene naphthalate) the organic phosphors show much increased stability in air as compared with other thermoplastic polymers such as PMMA (poly methyl metha acrylate), PS (poly styrene) and PC (poly carbonate).

In some applications it is desirable to use injection molded components of such a remote phosphor element. However, one of the problems associated with aromatic polyesters appears to be their rest absorbance in the blue part of the spectrum which becomes rather large when the thickness of the aromatic polyester layer, such as a PET layer or a PEN layer, is in the order of a few mm which is often used in injection molding. This may then lead to a reduced efficiency of the component.

In order to solve this problem we suggest using an incompatible polymer blend where the dye is placed in the polyester phase while the other phase is of a polymer which shows no (substantial) light absorption, especially not in the visible. The first polymer is especially not an aromatic polyester (and thereby incompatible with the aromatic polyester).

It further appears, however, that many luminescent dye molecules are soluble in most polymers which can be used for this purpose and therefore during processing they may leave the polyester and get into the other phase where they show short lifetime. This is not desirable as the apparent lifetime is determined by the other phase and not by the aromatic polyester layer phase.

Hence, it is an aspect of the invention to provide an alternative lighting device and/or an alternative converter, which preferably further at least partly obviate one or more of above-described drawbacks. Further, it is an aspect of the invention to provide an alternative method for making such (transmissive) converter, especially having a long lifetime.

We therefore suggest the use of an incompatible blend of an aromatic polyester with another polymer, such as PMMA, where the luminescent dye molecules are covalently attached to the polyester so that during processing the blend the luminescent molecule remains in the polyester phase. In this way an injection moldable system can be produced with a good lifetime and high efficiency.

Hence, in a first aspect, the invention provides a lighting device ("device") comprising (a) a light source, for producing light source light, and (b) a converter ("converter")(for converting at least part of the light source light into luminescence (light)), wherein the converter comprises a matrix of a first polymer, the matrix containing discrete regions comprising a second polymer with luminescent functionality, wherein the second polymer comprises an aromatic polyester comprising luminescent moieties (which luminescent moieties have the function of converting at least part of said light source light into said luminescence (light)), and wherein the first polymer is chemically different from the aromatic polyester. The converter is radiationally coupled to the light source (for converting at least part of the light source light by the luminescent moieties into luminescence (light). The converter can therefore also be indicated as "light converter".

In yet a further aspect, the invention provides such (light) converter per se (for converting light into luminescence), wherein the converter comprises a matrix of a first polymer, the matrix containing discrete regions comprising a second polymer with luminescent functionality, wherein the second polymer comprises an aromatic polyester comprising luminescent moieties, and wherein the first polymer is chemically different from the aromatic polyester.

In yet another aspect, the invention provides a method for providing a converter, the method comprising (a) providing an aromatic polyester comprising luminescent moieties and a first polymer, wherein the first polymer is chemically different from the aromatic polyester, (b) embedding the aromatic polyester comprising luminescent moieties in the first polymer, and optionally shaping the thus obtained product.

It appears that with the invention a material can be made that relatively easily can be molded or shaped in e.g. a converter, such as with extrusion and/or injection molding, which may e.g. provide a flat converter plate or a shape article, such as a curved article. It also appears that the organic dye in this type of materials is relatively stable. A plurality of polymers was tried, but the aromatic polyester type of polymers appeared to be most stable of all tried polymers. For instance, polyimide systems gave a substantial lower stability. Further, the converter may combine the low light absorption of the main matrix, i.e. the first polymer, and the stability of the organic dye in the discrete regions due to the fact that the organic dye is covalently bound to the aromatic polyester. Further, the matrix of the first polymer may also function as a barrier, e.g. oxygen barrier, which may for instance be beneficial in view of lifetime improvement (of the luminescent material).

The lighting device comprises a light source. The light source, which is used in the lighting device to provide light source light to the converter, may at least partially be embedded in the converter. For instance, a self-supporting converter may comprise one or more indentations or cavities, to host at least partially one or more light source(s), respectively. In yet another embodiment, the light source and converter may be configured to provide light source light in an edge of the converter. The light source may be in contact with the converter but may also be arranged at a non-zero distance from the converter ("remote light source"). Hence, in an embodiment, the light source is arranged remote from the converter. In some embodiments, the distance between the light source(s) and the wavelength converting member may be relatively small, so-called vicinity phosphor mode. However, in such embodiments the wavelength converting member still does not contact the light sources. The shortest distance between the light source, such as the LED die, and one or more of the converter, may be larger than 0 mm, especially equal to or larger than 0.1 mm, such as 0.2 or more, and in some embodiments even equal to or larger than 10 mm, such as 10-100 mm.

The light source can be any light source, but is especially a light source that is able to substantially emit in, violet and/or in the blue. Hence, in an embodiment the light source comprises a blue emitting light emitting device. In yet another embodiment, which may be combined with the former embodiment, the light source comprises a violet emitting light emitting device. Hence, the term light source may in especially relate to a LED (light emitting diode). Preferably, the light source is a light source that during operation emits at least light at wavelength selected from the range of 400-480 nm, especially 420-460. This light may partially be used by the light conversion element (see below).

In a specific embodiment, the light source comprises a solid state LED light source (such as a LED or laser diode). The term "light source" may also relate to a plurality of light sources, such as 2-20 (solid state) LED light sources. In an embodiment, an (1D or 2D) array of light sources is applied to illuminate the converter. In another embodiment, the light source comprises an organic LED (OLED). Optionally, the light source is configured to generate blue light (and optionally violet light)(see also below), and part of the blue and/or optional violet light is used by one or more of the luminescent materials as excitation light and at least partially converted into luminescence. Combinations of different types of light sources may be applied.

The term "radiationally coupled" especially means that the light source and the converter are associated with each other so that at least part of the radiation emitted by the light source is received by the converter (especially the luminescent moieties) (and at least partly converted into luminescence by the luminescent moieties).

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10.000K. Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light. This blue component may partially be absorbed by the luminescent material and converted into luminescent material light. Optionally, a separate blue light source (such as a solid state LED) may be included in the light source.

The terms "violet light" or "violet emission" especially relates to light having a wavelength in the range of about 400-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm, especially 620-650 nm. The terms "visible", "visible light" or "visible emission" refer to light having a wavelength in the range of about 380-750 nm. The term "IR" (infra red), may especially relate to about 750-3000 nm, especially in the range of about 750-1100 nm.

The lighting device further comprises the above indicated converter. Especially, the converter is radiationally coupled to the light source. The term "radiationally Coupled" especially means that the light source and the luminescent material are associated with each other so that at least part of the radiation emitted by the light source is received by the luminescent material (and at least partly converted into luminescence). In general, the converter will be configured to be applied in transmissive mode, i.e. that light of the light source irradiates an upstream part of the converter, and at a downstream part luminescence from the luminescent moieties is obtained. However, in an embodiment, the converter may also be configured to be applied in reflective mode. In the former embodiment, the converter can be an exit window or part of an exit window, and in the latter embodiment, the converter can e.g. part of a wall of a light collection chamber.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

As will be clear to a person skilled in the art, the converter may also comprise a plurality of (light) converters. Hence, in an embodiment, the term "converter" may also refer to a plurality of converters. One or more of these can be configured in transmissive mode and/or one or more of these can be arranged in reflective mode. In an embodiment two or more (light) converters are arranged downstream from each other. Hence, in an embodiment the term (light) converter may also refer to a stack of light converters.

Especially when applying a light source which is configured to produce visible light, a converter with a first polymer with high light transmission (almost no light absorption) in the visible range may be applied. The first polymer must be highly transmissive. Due to the presence of the luminescent molecules the converter will show light absorption. However after the correction for the absorbance of the luminescent molecules (after subtracting the absorbance contribution from the luminescent molecules from the absorbance measured for the converter) the absorption of the converter in the visible range is in the range 0-4% (for a converter having a thickness of 2 mm).

The term "transmissive" herein may especially refer to a first polymer with a thickness of 2 mm that has a light absorption in the range of 0-4%, for light having a wavelength selected from the visible wavelength range. Herein, the term "visible light" especially relates to light having a wavelength selected from the range of 400-700 nm. The transmission can be determined by providing light at a specific wavelength with a first intensity to the waveguide under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). Note that the converter plate may be colored, due to the presence of luminescent material (see also below). Especially, the transmission of the first polymer, assuming a plate consisting of such polymer has a mean transmission value over the entire wavelength of 400-700 nm of equal to or higher than 96%. In an embodiment, the lowest transmission in this entire wavelength range is not lower than 75%.

The converter may have any shape, such as a layer or a self supporting body. It may be flat, curved, shaped, squared, round hexagonal, spherical tubular, cubic, etc. The self supporting body may be rigid or flexible. The thickness of the converter may in general be in the range of 0.1-10 mm. The length and/or width (or diameter) may be in the range of for instance 0.01-5 m, such as 0.02-5 m, for instance 0.1-50 mm.

The term "matrix" is used herein to indicate a layer or body or shaped article, etc., which hosts another material, such as the matrix of the first polymer being a matrix for the discrete regions. The converter may be a layer, for instance coated to a transmissive support; however, in general the converter will be a shaped (flexible) body. The converter may also be self supporting, and for instance be a plate or a (flexible) entity.

The matrix of the first polymer can in principle be any polymer that is or can be made transmissive for visible light, and may especially be a matrix comprising on one or more polymers selected from the group consisting of PC (polycarbonate), polymethylacrylate (PMA), polymethylmethacrylate (PMMA) (Plexiglas or Perspex), cellulose acetate butyrate (CAB), polyvinylchloride (PVC), COC (cyclo olefin copolymer), and polystyrene. In yet another embodiment, the first polymer may especially comprise one or more of a poly urethane, a polyalkane, a polyacrylate and a siloxane (such as a polydimethyl siloxane (PDMS)). This may especially be of relevance for flexible applications. Hence, in an embodiment, the first polymer is configured to provide flexible matrix. In this way, the converter may be a flexible unit. Especially, the first polymer comprises, and preferably essentially consists of, a polymer selected from the group consisting of PMMA (poly methyl methacrylate), PS (polystyrene), and PC (polycarbonate).

In a further embodiment, the first polymer of the converter or the lighting device, is highly transparent material showing almost no light absorption (less than 4% for a 1 mm thick sample) in the visible region (400-700 nm ). The second polymer may have a low oxygen transmission rate, especially where the luminescent moieties have a long lifetime. Characteristic values are: PVDC—poly vinylidene chloride (0.8 $cm^3/m^2 \cdot day \cdot bar$), PVDF—poly vinylidene fluoride (0.8 $cm^3/m^2 \cdot day \cdot bar$), EVOH—ethylene vinyl alcohol (0.5 $cm^3/m^2 \cdot day \cdot bar$), PBT—polybutylene terephthalate (5 $cm^3/m^2 \cdot day \cdot bar$), PEN—Poly ethyle naphthalate (8 $cm^3/m^2 \cdot day \cdot bar$), PAN—Poly acrylo nitrile (9 $cm^3/m^2 \cdot day \cdot bar$), PA6—Nylon6 (10 $cm^3/m^2 \cdot day \cdot bar$) or PET—Poly ethylene terephthalate (20 $cm^3/m^2 \cdot day \cdot bar$).

The discrete regions may have any shape. The shape may also depend upon the way the converter is made. In an embodiment, the converter is a layered converter, with the second polymer sandwiched between two first polymer layers. In yet another embodiment, the second polymer is molded through the first polymer (see also below), in yet another embodiment the matrix of the first polymer is made, including the second polymer blended therein, and then the thus obtained product is molded into a shaped converter body.

The discrete regions may have dimensions (such as length, width, height, diameter) in the range of 100 nm-5 mm. The particles may have any desired shape, such as spherical, cubic, star-like, cylindrical, randomly shaped etc. However, the second polymer may also form a network within the first polymer. The converter may also comprise differently shaped discrete regions.

The discrete regions are indicated as "discrete", since the discrete regions can be distinguished from the matrix of the first polymer. Boundaries between discrete regions and matrix of the first polymer can be observed and difference in chemical composition between matrix of the first polymer and particle can be evaluated. It is also possible to observe luminescence from the discrete regions and substantially no luminescence from the matrix. Advantageously, the luminescent moieties stay in the discrete regions, as they are bound to the aromatic polyester. In a specific embodiment, the discrete regions occupy in the range of 0.5-50 vol. %, such as 1-20 vol. %, such as 1-5 vol. %, of the volume of the transmissive converter.

The matrix of the first polymer may not only comprise the discrete regions comprising the second polymer, but may also comprise other components. Optionally, in addition the second polymer with luminescent functionality, the matrix may also contain other luminescent material (thus in addition to the luminescent material comprised by the discrete regions). In an embodiment, the other luminescent material comprises an inorganic luminescent material, selected from the group consisting of a lanthanide based luminescent material, a transition metal based luminescent material and a quantum dot material. Hence, for instance inorganic luminescent materials known from solid state lighting or from low-pressure or high-pressure lamps, or from plasma applications may be applied. Inorganic materials that for instance may be applied are trivalent cerium doped garnet systems, such as YAG:$Ce^{3+}$, and divalent Eu doped thiogallates, such as SrGa$_2$S$_4$:Eu$^{2+}$, and sulfides, such as SrS:Eu$^{2+}$, all well known in the art (see for instance U.S. Pat. Nos. 7,115,217 or 6,850,002). Also quantum dots (QD) may be applied. In another embodiment, the converter may further contain structures, such as particles, like $Al_2O_3$ containing particles and/or $TiO_2$ containing particles, and/or $BaSO_4$ containing particles, to e.g. promote extracting the light from the converter. In a specific embodiment, however, the discrete regions essentially consist of the second polymer. Combinations of such additives like luminescent materials and reflective materials may also be applied.

The second polymer, comprises as indicated above the aromatic polyester. The luminescent functionality is obtained by incorporating tin the aromatic polyester molecule(s) organic dyes. The term "incorporating" refers to one or more covalent bonds between the organic dye and the aromatic polyester. Hence, in an embodiment one or more of the luminescent moieties are part of a backbone of the aromatic polyester. Alternatively or additionally, in an embodiment one or more of the luminescent moieties are chemically attached (functional group) to a backbone of the aromatic polyester.

Especially, the aromatic polyester is PET (poly ethylene therephthalate) or PEN (polyethylene naphthalate) based. This especially implies that the aromatic polyester has a PET or PEN backbone, but also includes in the backbone and/or as functional groups luminescent moieties (chemically attached to the backbone). An example of a polyethyleneterephthalate (PET) polymer is e.g. PETG (glycol modified polyethyleneterephthalate). Hence, the first polymer is especially not PET (poly ethylene therephthalate) based or PEN (polyethylene naphthalate) based.

The aromatic polyester is preferably configured to be a thermoplastic polymer, optionally further having cross-linkable groups. Also the first polymer is preferably configured to be a thermoplastic polymer. Optionally, the first polymer may also further comprise cross-linkable groups.

The term "luminescent moiety" is applied to indicate that the luminescent species may be incorporated in the polymer backbone or polymer chain or may be present as side groups or functional groups to the polymer backbone or polymer chain. Of course, in a specific embodiment, the aromatic polyester chain may both comprise luminescent moieties within the backbone and luminescent moieties attached to the backbone. The term "luminescent moiety" may also relate to a plurality of luminescent moieties. In an embodiment, the aromatic ester comprising luminescent moieties is selected from the group consisting of a linear polymer, a (hyper)branched polymer, a cross-linked polymer, a star polymer, a dendrimer, a random copolymer, an alternating copolymer, a graft copolymer, a block copolymer, and a terpolymer.

In an embodiment, the content of luminescent moieties in second polymer is 10% by weight or less, such as 1% by weight or less, such as 0.1-10, like 0.2-5 wt. %, relative to the total weight of the second polymer.

Organic luminescent materials or organic dyes are currently being considered for remote luminescent material applications where blue light emitting diodes are used for pumping for instance green to red emitting luminescent material in order to obtain white light. Organic luminescent materials may have a number of advantages as compared with inorganic luminescent materials. The position and the band width of the luminescence spectrum can be designed with ease to be anywhere in the visible range to obtain high efficacy. They can also show much less light scattering and higher quantum efficiency further improving the system efficiency. Furthermore because of their organic and sustainable nature they may be several orders of magnitude cheaper than the inorganic LED luminescent materials so that they can be used in large area applications. Organic luminescent materials are herein also indicated as organic dyes.

There is a nearly unlimited assortment of such organic luminescent materials or dyes. Relevant examples are perylenes (such as dyes known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, and dyes such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other dyes, such as acid dyes, basic dyes, direct dyes and dispersion dyes may be used as long as they show a sufficiently high fluorescence quantum yield for the intended use. Hence, on or more of the luminescent moieties may comprise perylene groups, even more especially one or more of the luminescent moieties essentially consist of perylene groups. Especially, one or more luminescent moieties are configured to generate red luminescence upon excitation by blue and/or violet light.

Organic materials of special interest that may be applied comprise for instance perylene structures similar to such as BASF Lumogen 83 for green luminescence, BASF Lumogen F170 for yellow luminescence, BASF Lumogen F 240 for orange luminescence, and BASF Lumogen F 300 or F305 for red luminescence, but also Lumogen F Red 305 or Lumogen F Blue 650. Hence, the second polymer may for instance comprise one or more perylene derivatives. Optionally, the dye comprises a phosphorescent dye, that has a long decay time, such as hours, which may be applied for lighting during absence of (enough) daylight.

However such dyes per se are not photo chemically stable and degrade. Their photochemical stability can be improved by bringing them into aromatic polyesters. However such aromatic polyesters show rest absorption thus cannot be used as thick layers as this rest absorption leads to decreased efficiency of the system. It is more desirable to use polymers such as PPMA or PC. However in such matrices the photo chemical stability of luminescent dyes appear to be relatively low. Hence, the present invention provides a solution to these problems.

Dependent upon the type of light of the light source (see above), the luminescent moieties may for instance comprise a combination of green and red emitting materials, or a combination of yellow and red emitting luminescent materials, etc. In case a light source is applied that (predominantly) generates violet light, a combination of blue, green and red emitting luminescent moieties, or a combination of blue, yellow and red emitting luminescent moieties, etc., may be applied. In an embodiment, the lighting device is configured to generate white light based on the combination of the light source light and the converter. The light source light may be either substantially converted (in the case of violet light), or contribute to the lighting device light (in the case of blue light).

As indicated above, the first polymer is highly transparent. Further, especially the first polymeric chemically different from the aromatic polyester. Hence, the first polymer is especially not PEN or PET based. In general, the chemical composition of the first polymer is substantially different from composition of the second polymer. Further, in general the chemical composition of the matrix of the first polymer is different from the discrete regions (even irrespective of the luminescent moieties). Hence, in an embodiment the first polymer comprises a first polymer and the second polymer comprises a second polymer, and the first and the second polymer are substantially different. In general, any non-PET or non-PEN based polymer is incompatible with PET and PEN respectively. Hence, especially the first polymer is not PEN based and is not PET based.

The stability and lifetime of wavelength converting molecules may be improved by incorporating them in a aromatic polyester matrix (see also WO2012042438, which is incorporated herein by reference). Covalently attaching the wavelength converting moieties to the polymeric material however appears to improve lifetime even further. Thus, reducing the mobility of the wavelength converting molecules, and thereby also reducing the photochemical degradation of the wavelength converting molecules, as quenching thereof, by for example, aggregation is avoided. The inventors have surprisingly found that semi-crystalline polymers, such as aromatic polyesters, are particularly useful for this purpose as they have relatively low oxygen permeability after crystallization.

The inventive concept is in the ability to produce light converters, especially with a relatively thick form factor (thicker than 1 mm) and yet high transmissivitiy, which can be produced with a technique such as injection moulding where luminescent molecules have good photochemical stability. Making an incompatible blend of an aromatic polyester with a highly transmissive first polymer enables processing of the blend to a relatively thick form (higher than 1 mm) while aromatic polyester matrix takes care of good photo chemical stability. This leads to highly transmissive light converter with a good stability. Covalently linking luminescent molecules to the polyester is particularly advantageous and may make the luminescent molecule inmiscible with the highly transmissive first polymer. In this way the luminescent molecules remain in the aromatic polyester and do not get into the other polymer where its stability is worse.

In the embodiment of the invention, the transmissive polymer is a polymer which show high transmission. Preferably a mean absorption of less than 5%/mm more preferentially less than 2%/mm, especially less than 1%/mm (per mm polymer thickness) in the wavelength region 400-700 nm. Hence, in an embodiment the first polymer is a polymer having a absorption of less than 5%/mm, more preferentially less than 2%/mm and most preferentially less than 1%/mm in the wavelength range of 0400-700 nm. Note that the transmission and absorption of the first polymer is related to the first polymer per se, and not to the transmission of the converter. Especially, the maximum absorption (of the first polymer) is less than 20%/mm, even more especially less than 10%/mm, over the entire wavelength region 400-700 nm. Transmission (T) and absorption (A) relate as $A=1-To/Ti$, wherein Ti is the intensity of the visible light impinging on the item (such as the first polymer or the converter) and To is the intensity of the light escaping at the other side of the item.

In embodiments of the invention, the polymeric material may advantageously comprise a polyester. In embodiments of the invention, the wavelength converting moiety may be derived from a perylene.

In embodiments of the invention, the polymeric material having a polymeric backbone may comprise a random polyester copolymer comprising the wavelength converting moiety, the random polyester copolymer may comprise at least two different repeating units of the following general formula $n_1$, $n_2$, $n_3$, $n_4$:

wherein the repeating units may be randomly distributed along the length of the polymeric backbone,
wherein AA may be selected from the following first group of aromatic moieties:

wherein BB may be selected from the following: —$(CH_2)_2$—, —$(CH_2)_4$— or wherein CC and DD may be the wavelength converting moieties having one of the following general formula I, II, or III:

I

II

III in which $G_1$ may be a linear or branched alkyl group or oxygen-containing alkyl group $C_nH_{2n+1}O_m$, n being an integer from 1 to 44 and m<n/2, or Y, or a linking group;

each of A and C may independently be hydrogen, isopropyl, t-butyl, fluorine, methoxy, or unsubstituted saturated alkyl $C_nH_{2n+1}$, n being an integer from 1 to 16;

each of B, J and Q may independently be hydrogen, isopropyl, t-butyl, fluorine, methoxy, or unsubstituted saturated alkyl $C_nH_{2n+1}$, n being an integer from 1 to 16, or a linking group;

each of $G_2$, $G_3$, $G_4$ and $G_5$ may independently be hydrogen, fluorine, methoxy, or unsubstituted saturated alkyl group $C_nH_{2n+1}$, n being an integer from 1 to 16, or X, or a linking group;

each of D and M may independently be hydrogen, fluorine, methoxy, or unsubstituted saturated alkyl group $C_nH_{2n+1}$, n being an integer from 1 to 16;

each of E, I and L may independently be hydrogen, fluorine, methoxy, or unsubstituted saturated alkyl group $C_nH_{2n+1}$, n being an integer from 1 to 16, or a linking group;

and each of T, T', R, R' may independently be hydrogen, isopropyl, t-butyl, fluorine, alkyloxy, aryloxy, cyano $CO_2R^x$ $OCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

and wherein each wavelength converting moiety may comprise two linking groups at any two of the positions: $G_1$, $G_2$, $G_3$, $G_4$, $G_5$, E, I, L, B, J, Q, T, T', R, R', the linking groups providing covalent attachment of the wavelength converting moiety to the ester and/or alcohol functionalities of the random copolymer backbone.

Thereby, the wavelength converting moieties may be incorporated into the random copolymer backbone.

The content of the wavelength converting moieties in the random polyester copolymer may be adapted as desired by controlling the amount of repeating units comprising a wavelength converting moiety, i.e. the repeating unit of the general formula $n_2$ and $n_4$, with respect to the total amount of repeating units of the general formula $n_1$ and $n_3$. Typically, in the backbone of the random polyester copolymer the total number of the repeating unit of the general formula $n_1$ and $n_3$ may be larger than the total number of repeating units of the general formula $n_2$ and $n_4$, which both may comprise a wavelength converting moiety.

In embodiments of the invention, the random polyester copolymer may comprise a mixture of the repeating units: $n_1$, $n_3$ and $n_4$ (as given above), the repeating units may be randomly distributed along the length of the polymeric backbone, the total number of repeating units of formula $n_1$ and $n_3$ may be larger than the total number of repeating units of formula $n_4$ in the polymeric backbone.

In embodiments of the invention, the random polyester copolymer may be a mixture of the repeating units: $n_1$, $n_2$ and $n_4$ (as given above), the repeating units are randomly distributed along the length of the polymeric backbone, the total number of repeating units of formula $n_1$ may be larger than the total number of repeating units of formula $n_2$ and $n_4$ in the polymeric backbone.

In embodiments of the invention, the random polyester copolymer may comprise repeating units of at least two different repeating units of the general formula $n_1$, $n_2$, $n_3$, $n_4$ (as given above), wherein AA may be the following aromatic moiety:

In embodiments of the invention, the polymeric material having a polymeric backbone may comprise a random polyolefine copolymer comprising the wavelength converting moiety, the random polyolefine copolymer may comprise at least two different repeating units of the following general formula $m_1$ and $m_2$:

in which $X^1$ independently may be hydrogen, fluorine, chlorine, methyl or ethyl; $X^2$ independently may be hydrogen, methyl, hydroxide, acetate, nitrile, $C_6H_5$ or $CO_2\ C_nH_{2n+1}$, n being 0 or an integer from 1 to 6; and $X^3$ may be a wavelength converting moiety having one of the following general formula I, II, or III:

in which $G_1$ may be a linear or branched alkyl group or oxygen-containing alkyl group $C_nH_{2n+1}O_m$, n being an integer from 1 to 44 and m<n/2, or Y, or a linking group;

each of A and C may independently be hydrogen, isopropyl, t-butyl, fluorine, methoxy, or unsubstituted saturated alkyl $C_nH_{2n+1}$, n being an integer from 1 to 16;

each of B, J and Q may independently be hydrogen, isopropyl, t-butyl, fluorine, methoxy, or unsubstituted saturated alkyl $C_nH_{2n+1}$, n being an integer from 1 to 16, or a linking group;

each of $G_2$, $G_3$, $G_4$ and $G_5$ may independently be hydrogen, fluorine, methoxy, or unsubstituted saturated alkyl group $C_nH_{2n+1}$, n being an integer from 1 to 16, or X, or a linking group;

each of D and M may independently be hydrogen, fluorine, methoxy, or unsubstituted saturated alkyl group $C_nH_{2n+1}$, n being an integer from 1 to 16;

each of E, I and L may independently be hydrogen, fluorine, methoxy, or unsubstituted saturated alkyl group $C_nH_{2n+1}$, n being an integer from 1 to 16, or a linking group;

and each of T, T', R, R' may independently be hydrogen, isopropyl, t-butyl, fluorine, alkyloxy, aryloxy, cyano $CO_2R^x$ $OCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

wherein the repeating unit may be randomly distributed throughout the length of the random copolymer, the number of repeating units of formula $m_1$ may be larger than the number of repeating units of formula $m_2$ in the polymeric backbone;

and wherein each wavelength converting moiety may comprise one linking group at any one of the positions: $G_1$, $G_2$, $G_3$, $G_4$, $G_5$, E, I, L, B, J, Q, T, T', R, R', the linking group may comprise at least one of: —$CH_2$—, —O—, or —$CO_2$—, thereby providing a covalent attachment of the wavelength converting moiety to the polymer backbone of the polyolefine.

Thereby, the wavelength converting moieties may be attached as a side chain to the polymer backbone.

The content of the wavelength converting moieties in the random polyolefine copolymer may be adapted as desired by controlling the amount of repeating units comprising a wavelength converting moiety, i.e. the repeating unit of the general formula $m_2$, with respect to the total amount of repeating units of the general formula $m_1$.

In embodiments of the invention, the random polyolefine copolymer may comprise the at least two different repeating units of the general formula $m_1$ and $m_2$ (as given above), wherein $X^1$ may independently be hydrogen, chlorine, methyl; $X^2$ may independently be $C_6H_5$ or $CO_2\ C_nH_{2n+1}$, n being 0 or an integer from 1 to 6, or nitrile, and $X^3$ may be the wavelength converting moiety wherein the linking group may comprise —$CO_2$— for covalent attachment of the wavelength converting moiety to the polymer backbone of the random polyolefine copolymer.

In one embodiment of the invention, the wavelength converting moiety may have one of the general formula I or II (as shown above) comprising one linking group at one of the positions: $G_1$, B, J, or Q.

In embodiments of the invention, the polymeric material may comprise a random polyester or random polyolefine copolymer, comprising first repeating units selected from general formula $n_1$, $n_2$, $n_3$, and $n_4$, or $m_1$ and $m_2$ (as given above), wherein the first repeating units of the general formula $n_2$, $n_4$ or $m_2$ may comprise a first wavelength converting moiety of one of the general formula I, II or III (as given above), and comprising a second repeating units selected from the general formula $n_1$, $n_2$, $n_3$, and $n_4$, or $m_1$ and $m_2$, wherein the second repeating units of the general formula $n_2$, $n_4$ or $m_2$ may comprise a second wavelength converting moiety of one of the general formula I, II or III, wherein the first and second wavelength converting moieties may be different.

By using more than one type of wavelength converting molecule having different optical properties the spectral composition of the converted light can be more conveniently adapted as desired.

In embodiments of the invention, the content of the wavelength converting moieties in the polymeric material may preferably be 10% by weight or less, for example 1% by weight or less, such as 0.1% by weight or less. As discussed above, a desirable content of the wavelength converting moieties in the polymeric material may be achieved by adapting the total number of repeating units containing a wavelength converting moiety, i.e. repeating units of the general formula $n_2$, $n_4$ and $m_2$, respectively, with respect to the total number of non-containing repeating units of the general formula $n_1$, $n_3$ and $m_1$, respectively.

Furthermore, by the term "randomly distributed" should, in the context of this application, be understood as distributed according to a statistical distribution, as would be expected for a random copolymerization giving a random copolymer.

As indicated above, the invention also provides a method for providing a converter, the method comprising (a) providing an aromatic polyester comprising luminescent moieties and a first polymer, wherein the first polymer is chemically different from the aromatic polyester, (b) blending the aromatic polyester comprising luminescent moieties in the first polymer, and optionally shaping the thus obtained product. In an embodiment, the aromatic polyester comprising luminescent moieties is a cross-linked aromatic polyester comprising luminescent moieties. In such embodiment, the aromatic polyester may also be provides as particles (cross-linked polymeric particles).

Shaping can be done in different ways. In an embodiment, molding is applied, such as injection molding. In an embodiment, the method comprises blending the aromatic polyester comprising luminescent moieties in the first polymer and molding the thus obtained product into a molded converter. In yet another embodiment, the method comprises molding the aromatic polyester comprising luminescent moieties and the first polymer into a molded converter.

In this way, a converter, for converting light may be obtained, wherein the converter comprises a matrix of a first polymer, the matrix containing discrete regions comprising a second polymer with luminescent functionality, wherein the second polymer comprises an aromatic polyester comprising luminescent moieties, and wherein the first polymer is chemically different from the aromatic polyester.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

DETAILED DESCRIPTION OF THE EMBODIMENTS

Figure 1A:
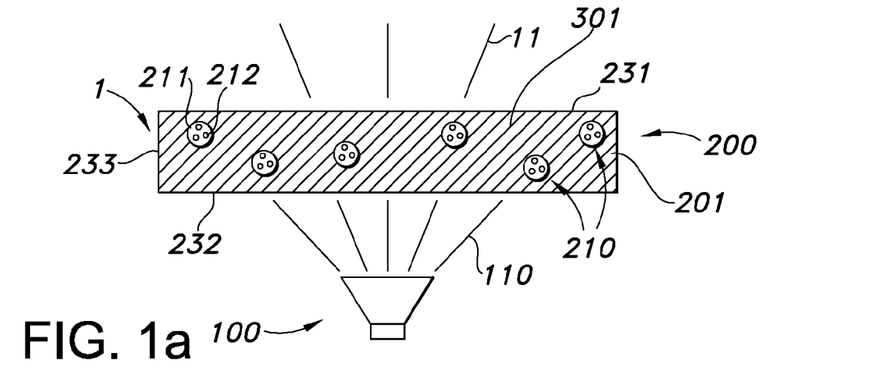
FIGS. 1a-1c schematically depict basic embodiments according to the invention.

FIG. 1a schematically depicts a lighting device 1 which comprises (a) a light source 100, such as a solid state LED or laser diode, for producing light source light 110. This may for instance be violet or blue light, especially blue light. The light source 100 may also be a plurality of light sources (see examples below), which may produce light source light 110 having substantially the same wavelength distributions or having different wavelength distributions (such as violet and blue light). Especially, visible light is produced, such as blue light and/or one or more of green, yellow, orange and red light.

The lighting device 1 further comprises (b) a converter 200. The converter 200 is arranged downstream of the light source 100. This converter 200 is especially configured. For instance, blue light may be at least partially converted to one or more of green, yellow, orange and red light. When producing lighting device light, indicated with reference 11, of white nature, and the light source light 110 being of blue nature, the converter 200, will convert part of the light source light 110 but also allow part of the light source light 110 transmit through the converter 200. The lighting device light 11 is shown at the downstream side of the converter 200 (i.e. emanating from the front face). Hence, here the converter 200 is transmissive (for at least the blue light, assuming the light source 100 being configured to generate blue light).

The converter 200 comprises a matrix 201 of first polymer 301 containing discrete regions 210. In fact, the discrete regions 210 are blended in the matrix 201 of first polymer 301.

The discrete regions 210 comprise a second polymer 211 with luminescent moieties 212 which are part of are attached to polymer backbones of aromatic polyesters. The luminescent moieties 212 is the converter, which absorb at least part of the light source light 110, and generated luminescent material light. Light 11 escaping from the converter 200 comprises at least the light generated by the luminescent moieties 212, but may optionally also comprise light source light 110. For instance, the light source light 110 may be blue light and the luminescent material light might be yellow and red light. Together, white light as lighting device light 11 may be generated.

The luminescent moieties 212 in the device 1 may be lit by LEDs behind the (flexible) configuration. For instance, a full array of LEDs can be used (see also below). The converter 200 has a back face 232 and a front face 231, and in general an edge 233. The converter 200 may be lit in a direction from the back face 232 to the front face 231. Optionally and/or additionally, the converter 200 may be lit at the edge face 233 with the light source(s) 100.

The thickness of the converter is the distance between back face 232 and a front face 231. As indicated above, this thickness may e.g. be in the range of 0.1-10 mm. Here, the light source is at a non-zero distance from the converter, such as at a distance of 0.1-100 mm. However, optionally the light source is in physical contact with the converter (see also below).

Figure 1B:
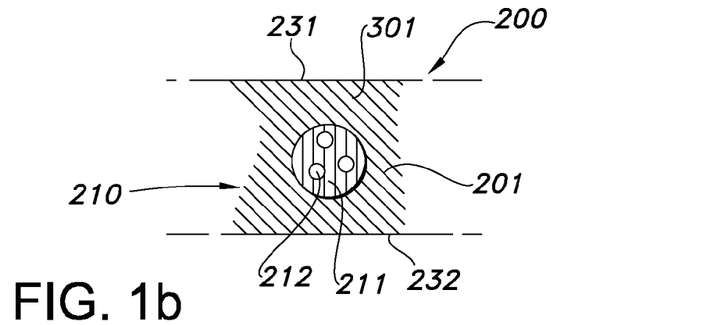

FIG. 1*b* schematically depicts in more detail the converter 200. The discrete regions 210 are blended in the matrix of the matrix 201 of first polymer 301. The particles 210 themselves comprise the second polymer 211, with luminescent moieties 212 which are part of are attached to polymer backbones of aromatic polyesters (second polymer 211). Here, by way of example, particulate luminescent material is depicted, but the luminescent moieties 212, for instance when comprising an organic dye, may also be molecularly dispersed in the second polymer 211. As mentioned above, in an embodiment also the matrix of the matrix 201 of first polymer 301 may comprise luminescent material (not depicted) (in addition to the second polymer 211 comprising luminescent moieties 212) such as inorganic luminescent material.

Figure 1C:
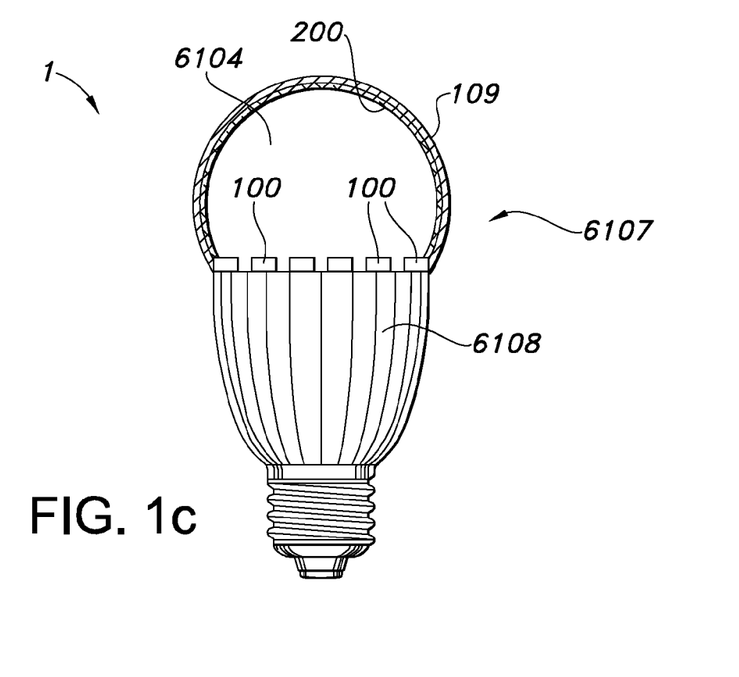

FIG. 1*c* shows an LED based light-emitting device according to an embodiment of the invention. The light-emitting device of this embodiment is provided as a retrofit lamp 6107. The phrase retrofit lamp is well known to the person skilled in the art and refers to an LED based lamp having an outer appearance of an older type of lamp which did not have an LED. The lamp 6107 comprises a base part 6108, which is provided with a traditional cap 6108, such as an Edison screw cap or a bayonet cap. Further, the lamp 107 has a bulb shaped light outlet member 109 enclosing a cavity 104. A plurality of LEDs as light sources 100 are arranged on the base part 6108 within the cavity 6104. A wavelength converting element 110 is arranged on the inside of the light outlet member 6109, i.e. on the side of the light outlet member facing the cavity 6104.

The wavelength converting element, i.e. converter 200, may be applied as a coating on the light outlet member. It is also contemplated that the wavelength converting member may be a self-supporting layer, such as a film or sheet standing free from the light outlet member and having any suitable shape. Alternatively, it may be shaped as a hood member covering the LEDs at a certain distance from the LEDs and from the light outlet member.

The atmosphere within the cavity 6104 may be air, or it may be controlled so as to have a certain composition. For example, the cavity 6104 may be filled with an inert gas such as nitrogen or a noble gas e.g. argon. In embodiments of the invention, the oxygen concentration within the cavity 6104 may be kept at a low level, e.g. at 20% or less, at 15% or less, at 10% or less, at 5% or less, at 3% or less, 1% or less, 0.6% or less, and preferably at 0.1% or less, by total volume of the sealed cavity.

In embodiments of the wavelength converting element according to the invention, the polymeric material may comprise a polyester whereas the wavelength converting moieties may be derived from a perylene (see also above). FIG. 1*c* schematically depicts a retro fit lighting device. The use of the converter 200 in a retro fit lighting device 1 is also part of this invention. Applications include amongst others retrofit bulb, LED TL tubes (TLED), or such materials can be used as paint on a wall which can be illuminated by blue LEDs.

Figure 2A:
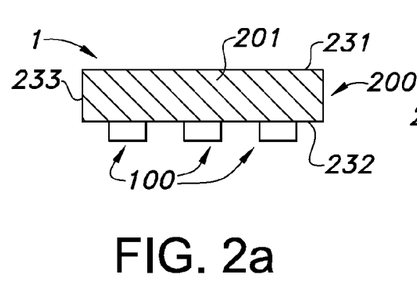
FIGS. 2a-2d schematically depict specific configuration of the converter and light source(s)

FIGS. 2*a*-2*d* schematically depict specific configuration of the converter and light source(s). FIG. 2*a* depicts and embodiment wherein the converter 200 is lit by light sources 100, especially LEDs, which are in a contact position.

Figure 2B:
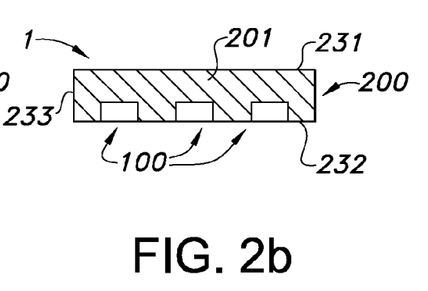

FIG. 2*b* schematically depicts an embodiment wherein the light source(s) 100 are at least partially blended in the converter 200. To this end, the converter 200 may comprise cavities, for instance in the back face 232.

Figure 2C:
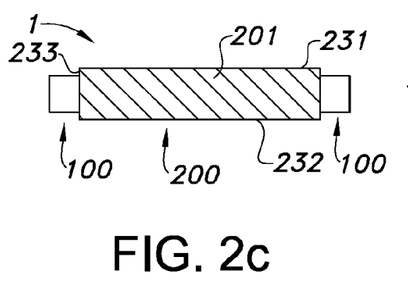

In FIG. 2*c*, the converter 200 is lit by one or more light sources 100, especially LEDs or laser diodes, which are at the edge(s) 233 of the converter 200, a so-called edge-lit configuration. By using such configuration very thin (flexible) lighting devices can be created. This is of special interest. The light source(s) 100 are depicted to be in contact with the converter 200, but are not necessarily configured in such a way (see by way of example also FIG. 2*d*). In this configuration light may also be coupled from sides into a transmissive wave guide (not shown) which can illuminate the converter. In this configuration the converter does not need to be in optical contact with the wave guide.

Figure 2D:
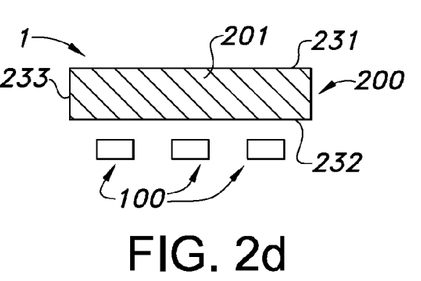

In FIG. 2*d*, the converter 200 is lit by one or more light source(s) 100, especially LEDs or laser diodes, which are in a non-contact position. Such a configuration may be desirable in flexible luminaire systems. However, such a configuration may also be applied in systems wherein the converter is not flexible. The distance between the light sources (such as the die of a LED) and the converter, is as indicated above.

For all lighting devices 1 described herein applies that the converter 200 may comprise one or more optical layers or optical items, such as reflective layers or mirrors, wavelength selective layers or mirrors, etc. For the sake of clarity, such layers or items have not been depicted.

Further, in a specific embodiment, blue emitting LEDs are used. In a further embodiment, LEDs emitting at different wavelength(s) can be used as well.

Not depicted, but also included herein, are configurations wherein at the side of the front face 231 a reflector or reflector layer is arranged, configured to reflect luminescent material light and optionally light source light 110 in a direction from the back face 232, and lighting device light 11 emanates from the back face 232 of the lighting device 1.

FIGS. 1c-2d and 3c schematically depict how the converter can be radiationally coupled to the light source.

Figure 3A:
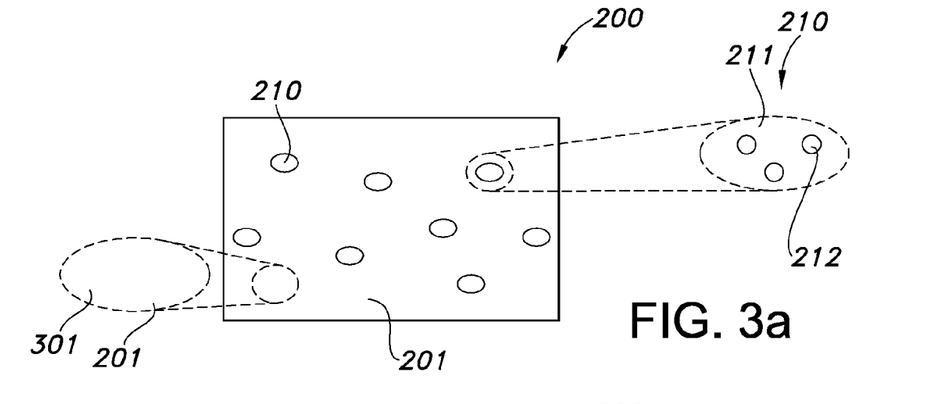
FIGS. 3a-3c schematically depict a number of variants and options within the present concept.
Figure 3B:
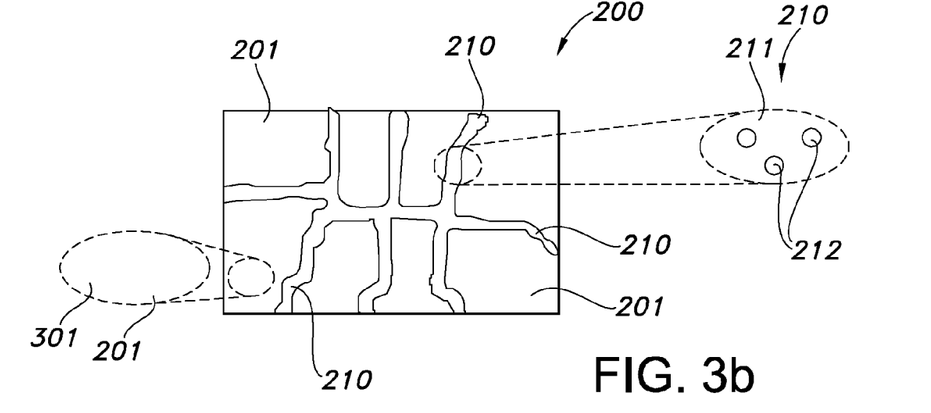

As indicated above, the converter 200 comprises a matrix 201 of a first polymer, the matrix 201 containing discrete regions 210 comprising a second polymer 211 with luminescent functionality, wherein the second polymer 211 comprises an aromatic polyester comprising luminescent moieties 212, and wherein the first polymer is chemically different from the aromatic polyester. Hence, the use of an incompatible blend of an aromatic polyester with another polymer such as PMMA PS or PC where the luminescent dye molecules are covalently attached to the polyester so that during processing the blend the luminescent molecule remains in the polyester phase is especially suggested. Phase 1 may be distributed in phase 2 in different ways. For examples, besides the illustration in FIG. 3a, phase 1 may form a network of aromatic polyester domains as shown in FIG. 3b. In this way an injection moldable system can be produced with a good lifetime and high efficiency.

In a first embodiment we suggest a luminescent element comprising an incompatible blend of a first polymer and a second polymer and a luminescent dye, in which the luminescent dye molecules are covalently attached to the second polymer, and in which the second polymer is a polymer with low oxygen permeability such as polyester and the first polymer is not a polyester.

Figure 3C:
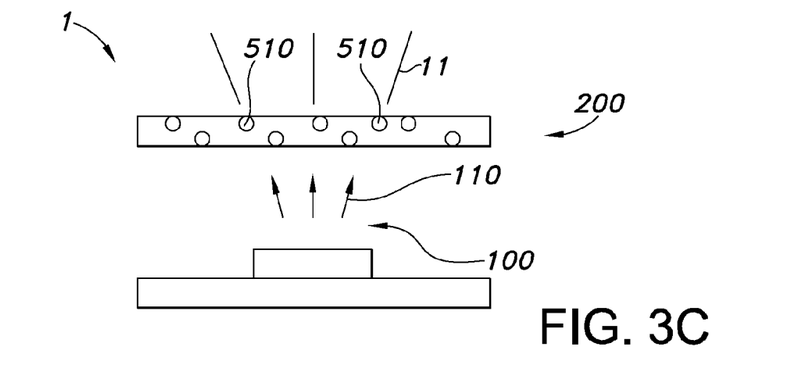

FIG. 3c schematically depicts an embodiment wherein the converter 200 further comprises additive 510. Such additives may be particulate. Such additives may be dispersed. The additives 510 may be reflective particles, but may alternatively or additionally also comprise other luminescent material. Inorganic materials that for instance may be applied are trivalent cerium doped garnet systems, such as YAG:Ce$^{3+}$, and divalent Eu doped thiogallates, such as SrGa$_2$S$_4$:Eu$^{2+}$, and sulfides, such as SrS:Eu$^{2+}$, all well known in the art (see for instance U.S. Pat. Nos. 7,115,217 or 6,850,002). Also quantum dots (QD) may be applied. In another embodiment, the converter may further contain structures, such as particles, like Al$_2$O$_3$ containing particles and/or TiO$_2$ containing particles, to e.g. promote extracting the light from the converter. Hence, optionally the matrix may comprise scattering elements, e.g. particles of Al$_2$O$_3$ or TiCO$_2$. Examples of inorganic phosphors suitable for the wavelength converting material include, but are not limited to, cerium doped yttrium aluminum garnet (Y$_3$Al$_5$O$_{12}$:Ce$^{3+}$, also referred to as YAG:Ce or Ce doped YAG) or lutetium aluminum garnet (LuAG, Lu$_3$Al$_5$O$_{12}$), α-SiAlON:Eu$^{2+}$ (yellow), and M$_2$Si$_5$N$_8$:Eu$^{2+}$ (red) wherein M is at least one element selected from calcium Ca, Sr and Ba. Another example of an inorganic phosphor that may be used in embodiments of the invention, typically in combination with a blue light emitting light source, is YAG:Ce. Furthermore, a part of the aluminum may be substituted with gadolinium (Gd) or gallium (Ga), wherein more Gd results in a red shift of the yellow emission. Other suitable materials may include (Sr$_{1-x-y}$B$_{ax}$C$_{ay}$)$_{2z}$Si$_{5a}$Al$_a$N$_{8a}$O$_a$:Eu$_z^{2+}$ wherein 0≤a<5, 0≤x≤1, 0≤y≤1 and 0<z≤1, and (x+y)≤1, such as Sr$_2$Si$_5$N$_8$:Eu$^{2+}$ which emits light in the red range. In embodiments of the invention the wavelength converting material may comprise quantum dots. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide (CuInS$_2$) and/or silver indium sulfide (AgInS$_2$) can also be used. Quantum dots show very narrow emission band and thus they show saturated colors. Furthermore the emission color can easily be tuned by adapting the size of the quantum dots. Any type of quantum dot known in the art may be used in the present invention, provided that it has the appropriate wavelength conversion characteristics. However, it may be preferred for reasons of environmental safety and concern to use cadmium-free quantum dots or at least quantum dots having a very low cadmium content.

Figure 4A:
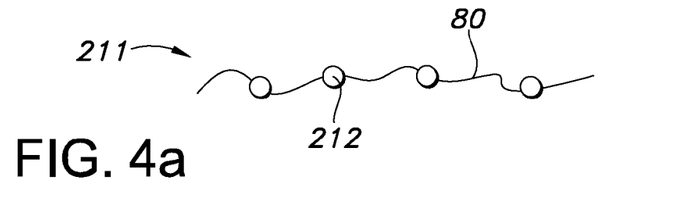
FIGS. 4a-4d schematically depict a number of embodiments of the aromatic polyester with luminescent moieties.

The luminescent dye molecules may be covalently attached in the main polymer chain of the polyester polymer, as shown in FIG. 4a. The polymer chain or backbone is indicated with reference 80.

Figure 4B:
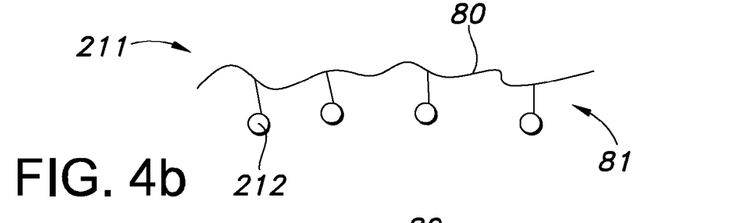

In another embodiment, we suggest that the luminescent dye molecules are covalently attached to a side chain of a polymer with low oxygen permeability such as the polyester, as shown in FIG. 4b. Reference 81 indicates functional groups, here at least including the luminescent moiety 212.

Figure 4C:
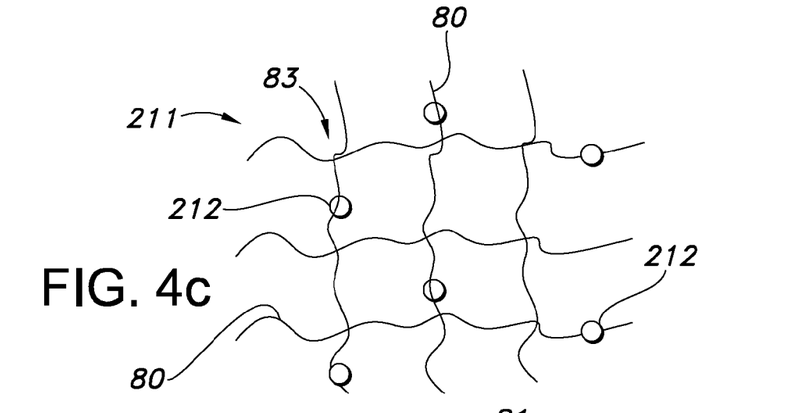
Figure 4D:
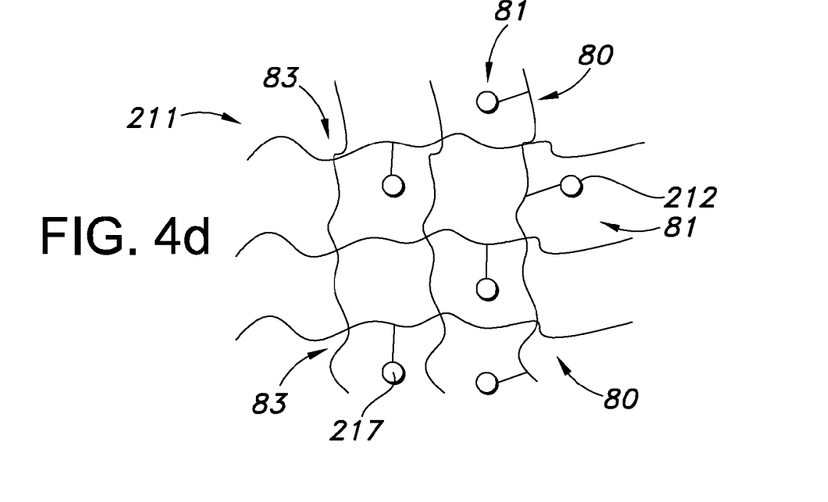

In another embodiment, we suggest that the luminescent dye molecules are covalently attached in the main chain of the second polymer, in which the second polymer is cross-linked, as shown in FIG. 4c. Reference 83 indicates cross-links. The same idea may apply to the polymer schematically depicted in FIG. 4b. Hence, In another embodiment, we suggest that the luminescent dye molecules are covalently attached in the side chain of the second polymer, in which the second polymer is cross-linked, as shown in FIG. 4c.

Again, the polymer is a thermoplastic material with reactive groups which can be cross-linked to form a 3D network.

It goes without saying that also combinations of polymer configurations described here above can be used as well.

In another embodiment we suggest a luminescent element comprising an incompatible blend of a second polymer, a first polymer and a third polymer and a luminescent dye, in which the luminescent dye molecules are covalently attached to the second polymer, and in which the second polymer is a polyester and the first and third polymer is not a polyester. In yet another embodiment we suggest a luminescent element comprising an incompatible blend of a second polymer, a first polymer and a third polymer and a luminescent dye, in which the luminescent dye molecules are covalently attached to the second polymer and first polymer, and in which the second polymer and first polymer are a polyester and the third polymer is not a polyester.

In yet another embodiment we suggest a luminescent element comprising an incompatible blend of a second polymer, a first polymer and a third polymer and a luminescent dye, in which the luminescent dye molecules is covalently attached to the second polymer, and in which the second polymer and first polymer are a polyester and the third polymer is not a polyester. In a preferred embodiment, the second polymer is a polyester is a PET and PEN polymer. In another embodiment, the first polymer is not a polyester but another other thermoplastic polymers such as PMMA, PS and PC.

Figure 5A:
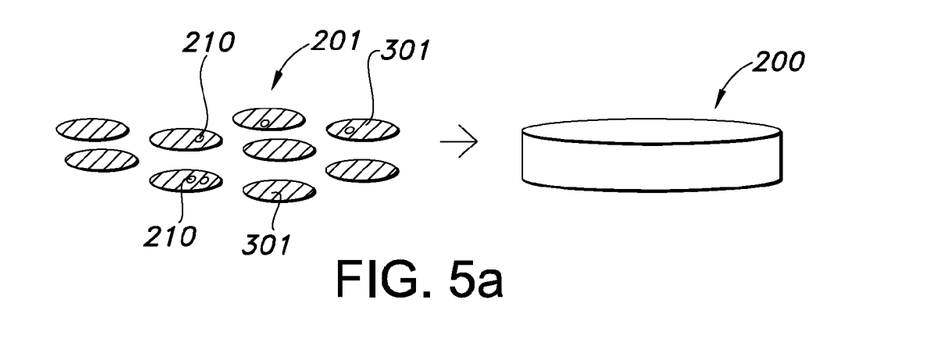
FIGS. 5a-5b schematically depict some embodiments of the method to make the converter.
Figure 5B:
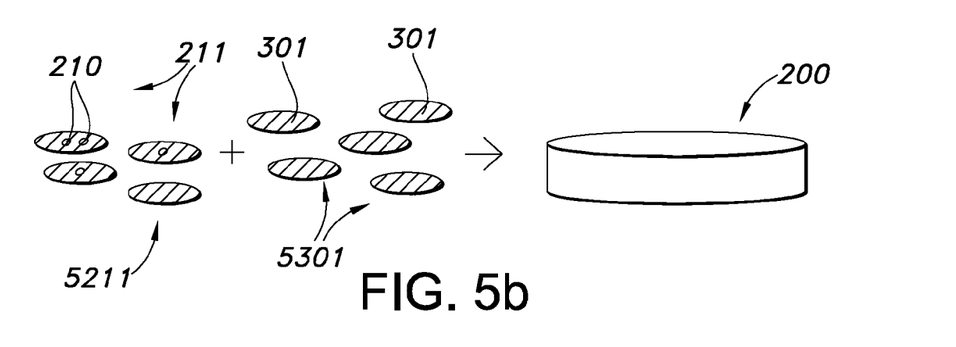

The herein suggested light conversion elements, i.e. converters 200, can be made by injection molding of granulate comprising suggested blend, see e.g. FIG. 5a. However, can also be made by injection molding of a mixture of granulate of the different materials, see e.g. FIG. 5b. Reference 5211 refers to particles of the second polymer 211 and reference 5301 refers to particles of first polymer 301.

EXAMPLE

Figure 6:
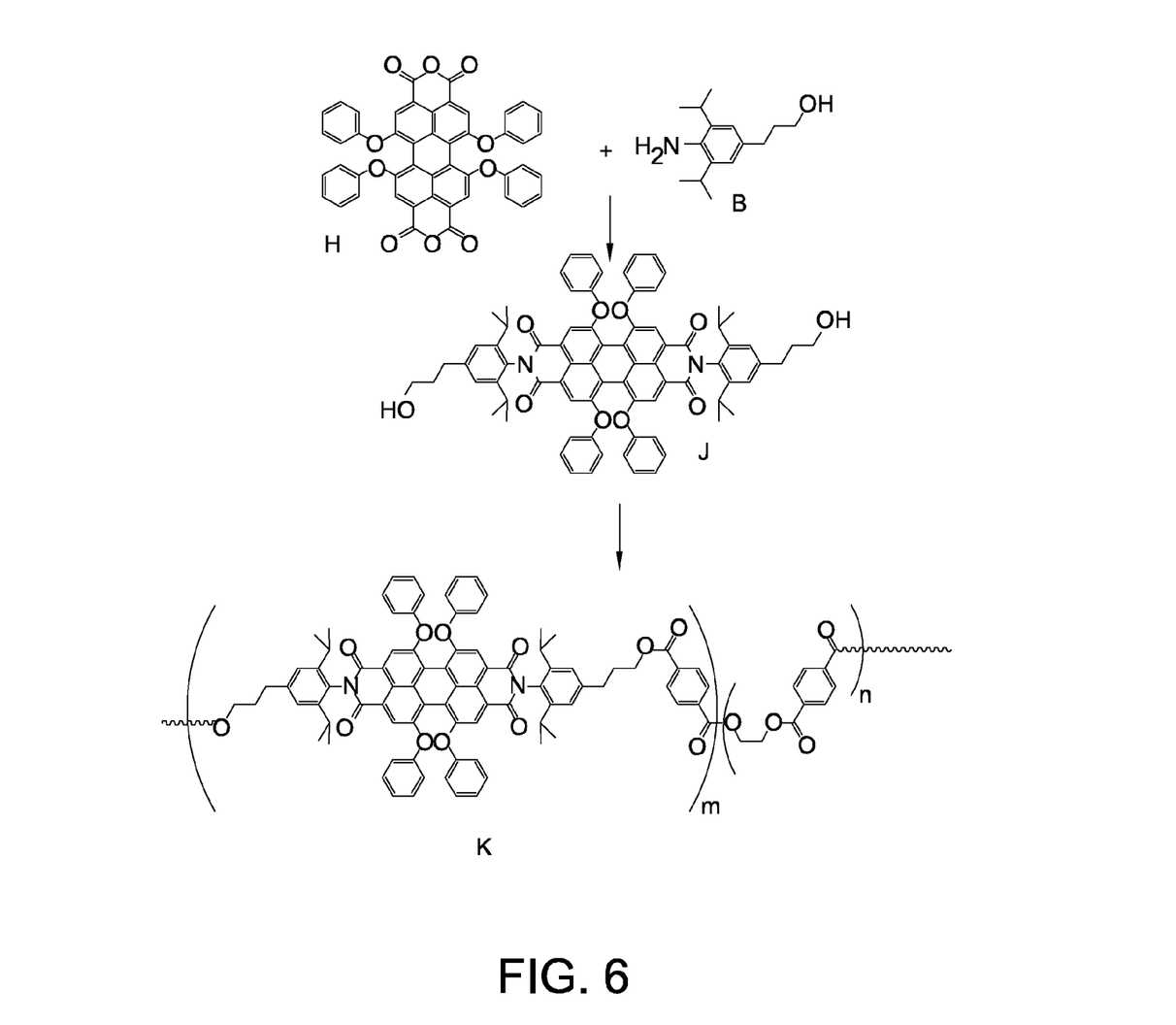
FIG. 6 schematically depicts an embodiment of making a polymeric material with a luminescent moiety.

As shown in FIG. 6, n and m being an integer, a random copolymer K was prepared by poly condensation of a mixture of polymerizable dye monomer J, glycol and dimethylterpthalate.

Compound H was prepared according to : Dotcheva, Dobrinka; Klapper, Markus; Muellen, Klaus, Macromolecular Chemistry and Physics (1994), 195(6), 1905-11

N,N'-Bis-(4-(3-Hydroxypropyl)-2,6-Diisopropylphenyl)-1,6,7,12-Tetrapheno Xyperylene-3,4,9,10-Tetracarboxdiimide J:

1,6,7,12-tetraphenoxyperylene-3,4:9,10-tetracarboxy-3, 4,9,10-bisanhydride H (600 mg, 0.79 mmol), zinc acetate dihydrate (351.2 mg, 1.60 mmol) and aniline B (1.6 g, 6.8 mmol) were mixed with imidazole (10 g). The reaction mixture was stirred at 150° C. (ext) for 24 h under nitrogen. After cooling to room temperature, 1 N HCl aq was added to the mixture until an acidic pH was obtained. The resulting mixture was extracted with DCM (4×). the combined DCM solution was dried with Na2SO4. After evaporation of the solvent, the crude product was purified by silica gel column chromatography eluting with DCM to CM/MeOH=40/1 to give perylene bisimide J (220 mg, 23% yield) as a dark purple solid.

Co-polyester K. A mixture of 2.9 mg of J, 101 g of dimethyl terphthalate, 50 g of ethylene glycol, 0.08 g of calcium acetate dehydrate and 0.015 g of antimony trioxide was heated under a flow of nitrogen in a polymerization reactor at 200° C. for three hours. Then vacuum was applied and reaction was continued for 4 hours while the temperature steadily increased until 280° C. while the excess ethylene glycol was distilled off. Upon cooling a red solid was obtained.

A film (film 3), made by extrusion of this polymeric materials was formed. The thickness of the layer was set so that the transmission of blue light was 90%.

PET was made in the same manner as described above but omitting compound J. This polymer was mixed with the corresponding amount (as of dye J above) of the structurally very similar non-copolymerizable dye F-305 (BASF, Ludwigshafen) and a film (film 4) was prepared in the same manner as described above such that film 4 had equal optical properties as film 3 prepared from the copolymer.

In order to test the lifetime, both films were illuminated with blue light at $4.1/W/cm^2$ at 60° C. The lifetime is estimated as 10% reduction in the luminescence intensity. Film 3 prepared from the copolymer showed a three times longer lifetime than film 4 prepared from the (non-copolymerized) mixture of PET and F-305.

The person skilled in the art realizes that the present invention by no means is limited to the preferred embodiments described above. On the contrary, many modification and variations are possible within the scope of the appended claims. For example, each wavelength converting moiety may comprise two or more linking group at any one of the positions: $G_1$, $G_2$, $G_3$, $G_4$, $G_5$, E, I, L, B, J, Q, T, T', R, R', and thereby achieving cross-linkage between polymeric backbones giving rise so-called polymeric network.

With injection molding, the above polymer with luminescent moieties in the form of granules (particles) was blended with PMMA. The blend was investigated using luminescent microscopy. It was observed that there was no luminescence coming out of PMMA regions while copylester regions were highly luminescent. For comparison, a polyester compound as above containing luminescent molecules (with a very similar structure as above) which were not covalently bonded to the polyester molecules were produced. The polyester compound containing luminescent molecules were subsequently blended with PMMA. The blend was then investigated using luminescence microscope. It was observed that the luminescent molecule were not only within the polyester but also they moved into the PMMA regions.

The invention claimed is:

1. A lighting device comprising:
a light source for producing light source light, and
a converter, wherein the converter comprises a matrix of a first polymer, the matrix containing discrete regions comprising a second polymer with luminescent functionality, wherein the second polymer comprises an aromatic polyester comprising luminescent moieties, wherein one or more of the luminescent moieties comprise perylene groups, wherein the first polymer is chemically different from the aromatic polyester, wherein the converter is radiationally coupled to the light source, wherein one or more of the luminescent moieties are part of a backbone of the aromatic polyester and/or wherein one or more of the luminescent moieties are chemically attached to a backbone of the aromatic polyester.

2. The lighting device according to claim 1, wherein the first polymer comprises a polymer selected from the group consisting of PMMA (poly methyl methacrylate), PS (polystyrene), and PC (polycarbonate), and wherein the aromatic polyester is PET (polyethylene therephthalate) or PEN (polyethylene naphthalate) based.

3. The lighting device according to claim 1, wherein the aromatic polyester comprising luminescent moieties is selected from the group consisting of a linear polymer, a (hyper)branched polymer, a cross-linked polymer, a star polymer, a dendrimer, a random copolymer, an alternating copolymer, a graft copolymer, a block copolymer, and a terpolymer.

4. The lighting device according to claim 1, wherein the discrete regions occupy in the range of 0.5-50 vol. % of the volume of the converter.

5. The lighting device according to claim 1, wherein the content of luminescent moieties in the second polymer is 10% by weight or less.

6. The lighting device according to claim 1, wherein the light source comprises a solid state light source, wherein the first polymer comprises a polymer selected from the group consisting of PMMA (poly methyl methacrylate), PS (polystyrene), and PC (polycarbonate), and wherein the aromatic polyester is PET (poly ethylene therephtralate) based or PEN (polyethylene naphthalate) based.

7. A converter, for converting light into luminescence, wherein the converter comprises a matrix of a first polymer, the matrix containing discrete regions comprising a second polymer with luminescent functionality, wherein the second polymer comprises an aromatic polyester comprising luminescent moieties, wherein one or more of the luminescent moieties comprise perylene groups, wherein one or more of the luminescent moieties are part of a backbone of the aromatic polyester and/or wherein one or more of the luminescent moieties are chemically attached to a backbone of the aromatic polyester, and wherein the first polymer is chemically different from the aromatic polyester.

8. The converter according to claim 7, wherein the first polymer is a polymer having an absorption of less than 5%/mm in the wavelength range of 400-700 nm.

9. A method for providing a converter, the method comprising providing an aromatic polyester comprising luminescent moieties wherein one or more of the luminescent moieties are part of a backbone of the aromatic polyester and/or wherein one or more of the luminescent moieties are chemically attached to a backbone of the aromatic polyester, and a first polymer, wherein the first polymer is chemically different from the aromatic polyester, blending the aromatic polyester comprising luminescent moieties in the first polymer, and optionally shaping the thus obtained product.

10. The method according to claim 9, wherein the aromatic polyester comprising luminescent moieties is a cross-linked aromatic polyester comprising luminescent moieties.

11. The method according to claim 10 wherein the method comprises blending the aromatic polyester comprising luminescent moieties in the first polymer and molding the thus obtained product into a molded converter.

12. The method according to claim 10, wherein the method comprises molding the aromatic polyester comprising luminescent moieties and the first polymer into a molded converter.

13. The lighting device according to claim 1, wherein the light source comprises a blue light emitting light source.

14. The lighting device according to claim 1, wherein the light source comprises a violet light emitting light source.

15. The lighting device according to claim 1, wherein the light source comprises a solid state light source.

16. The lighting device according to claim 15, wherein the solid state light source comprises a light emitting diode (LED).

17. The converter according to claim 7, wherein the converter has a thickness in the range of 0.1-10 mm.

* * * * *